(12) United States Patent
Hertkorn et al.

(10) Patent No.: US 9,373,747 B2
(45) Date of Patent: Jun. 21, 2016

(54) METHOD FOR PRODUCING AN OPTOELECTRONIC COMPONENT

(75) Inventors: Joachim Hertkorn, Alteglofsheim (DE); Tetsuya Taki, Tokyo (JP); Karl Engl, Pentling (DE); Johannes Baur, Regensburg (DE); Berthold Hahn, Hemau (DE); Volker Haerle, Deuerling (DE); Ann-Kathrin Haerle, legal representative, Deuerling (DE); Jakob Johannes Haerle, legal representative, Deuerling (DE); Johanna Magdalena Haerle, legal representative, Deuerling (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/344,573

(22) PCT Filed: Sep. 12, 2012

(86) PCT No.: PCT/EP2012/067808
§ 371 (c)(1),
(2), (4) Date: Jun. 2, 2014

(87) PCT Pub. No.: WO2013/041424
PCT Pub. Date: Mar. 28, 2013

(65) Prior Publication Data
US 2015/0044798 A1 Feb. 12, 2015

(30) Foreign Application Priority Data
Sep. 19, 2011 (DE) .......................... 10 2011 113 775

(51) Int. Cl.
*H01L 33/00* (2010.01)
*H01L 21/762* (2006.01)
(Continued)

(52) U.S. Cl.
CPC ...... *H01L 33/0079* (2013.01); *H01L 21/76254* (2013.01); *H01L 33/0075* (2013.01); *H01L 33/06* (2013.01); *H01L 33/12* (2013.01); *H01L 33/32* (2013.01)

(58) Field of Classification Search
None
See application file for complete search history.

(56) References Cited

U.S. PATENT DOCUMENTS 5,374,564 A 12/1994 Bruel
8,030,176 B2 10/2011 Kubota et al.
(Continued)

FOREIGN PATENT DOCUMENTS

DE 102005052358 A1 3/2007
EP 1675189 A2 6/2006
(Continued)

*Primary Examiner* — Charles Garber
*Assistant Examiner* — Stanetta Isaac
(74) *Attorney, Agent, or Firm* — Slater Matsil, LLP (57) ABSTRACT

A method for producing an optoelectronic component is provided. A transfer layer, containing $In_xGa_{1-x}N$ with $0<x<1$, is grown onto a growth substrate. Subsequently, ions are implanted into the transfer layer to form a separation zone, a carrier substrate is applied, and the transfer layer is separated by way of heat treatment. A further transfer layer, containing $In_yGa_{1-y}N$ with $0<y\leq 1$ and $y>x$, is grown onto the previously grown transfer layer, ions are implanted into the further transfer layer to form a separation zone, a further carrier substrate is applied, and the further transfer layer is separated by way of heat treatment. Subsequently, a semiconductor layer sequence, containing an active layer, is grown onto the surface of the further transfer layer facing away from the further carrier substrate.

17 Claims, 5 Drawing Sheets

(51) Int. Cl.
*H01L 33/06* (2010.01)
*H01L 33/12* (2010.01)
*H01L 33/32* (2010.01)

(56) References Cited

U.S. PATENT DOCUMENTS

| | | | |
|---|---|---|---|
| 8,148,246 B2 | 4/2012 | Lin et al. | |
| 8,372,673 B2 | 2/2013 | Lee et al. | |
| 8,711,893 B2 | 4/2014 | Avramescu et al. | |
| 2008/0296584 A1 | 12/2008 | Hachigo | |
| 2009/0117711 A1 | 5/2009 | Harle et al. | |
| 2010/0072489 A1 | 3/2010 | McLaurin et al. | |
| 2012/0161289 A1* | 6/2012 | Werkhoven | H01L 21/02002 257/615 |

FOREIGN PATENT DOCUMENTS

| | | |
|---|---|---|
| JP | 2002222772 A | 8/2002 |
| JP | 2005109478 A | 4/2005 |
| JP | 2009152305 A | 7/2009 |
| JP | 2009231816 A | 10/2009 |
| JP | 2009245982 A | 10/2009 |
| TW | 200715380 A | 4/2007 |
| TW | 200919576 A | 5/2009 |
| TW | 200947519 A | 11/2009 |
| TW | 200947816 A | 11/2009 |
| WO | 2005004231 A1 | 1/2005 |
| WO | 2006054737 A1 | 5/2006 |
| WO | 2007025497 A1 | 3/2007 |

\* cited by examiner

METHOD FOR PRODUCING AN OPTOELECTRONIC COMPONENT

This patent application is a national phase filing under section 371 of PCT/EP2012/067808, filed Sep. 12, 2012, which claims the priority of German patent application 10 2011 113 775.4, filed Sep. 19, 2011, each of which is incorporated herein by reference in its entirety.

TECHNICAL FIELD

The invention relates to a method for producing an optoelectronic component. The optoelectronic component can be in particular a light-emitting optoelectronic component such as, for example, an LED or a semiconductor laser.

BACKGROUND

In order to produce optoelectronic components having an emission wavelength of more than 360 nm, nitride compound semiconductor materials containing indium are frequently used. The electronic bandgap of the nitride compound semiconductor material can be adjusted in particular by the indium content. For example, in the material system $In_xGa_{1-x}N$ a bandgap between approximately 3.4 eV (GaN) and approximately 0.7 eV (InN) can be adjusted as a function of the indium content x.

The production of nitride compound semiconductor layers having a comparatively high indium content is, however, hindered by virtue of the fact that the lattice constant of the nitride compound semiconductor material increases as the indium content increases. This causes a lattice mismatch with respect to the growth substrates, such as sapphire or GaN, for example, which are generally used for the epitaxial growth of nitride compound semiconductor layers. One or several buffer layers, e.g., consisting of GaN, are generally initially grown onto the growth substrate before an indium-containing layer, in particular the active layer of the optoelectronic component, is grown.

By way of the growth of an indium-containing layer onto a growth substrate or a GaN semiconductor layer, comparatively large compressive stresses are generated in the indium-containing semiconductor layer owing to the different lattice constants. These stresses can result in flaws in the crystal structure which reduce the efficiency of the optoelectronic component.

U.S. Pat. No. 5,374,564 discloses a method for separating a semiconductor layer in the lateral direction, wherein ions are implanted into the semiconductor layer and heat treatment is subsequently effected.

SUMMARY OF THE INVENTION

Embodiments of the invention provide an improved method for producing an optoelectronic component which allows the production of an active layer, containing InGaN, with reduced stresses and improved crystal quality.

In accordance with at least one embodiment of the method for producing an optoelectronic component, initially a growth substrate is provided. The growth substrate is a substrate which is suitable for the epitaxial growth of a nitride compound semiconductor material, preferably a sapphire substrate, a GaN substrate or an SiC substrate. A transfer layer which contains at least one semiconductor layer consisting of $In_xGa_{1-x}N$ with $0<x<1$ is epitaxially grown onto the growth substrate. This transfer layer consisting of a semiconductor layer or of several sublayers is referred to as a transfer layer since in a subsequent method step it is at least partially separated from the growth substrate and is transferred to a carrier different from the growth substrate.

In a further method step, ions are implanted into the transfer layer in order to form a separation zone in the transfer layer. The ions are preferably hydrogen ions. Alternatively, the ions can be ions of inert gases such as, for example, helium, neon, krypton or xenon.

In accordance with one embodiment, in a further method step, a carrier substrate is applied to a surface of the transfer layer opposite to the growth substrate. The carrier substrate is connected to the transfer layer, for example, by soldering or bonding. Advantageously, in contrast to the growth substrate, the carrier substrate does not have to be suitable for the epitaxial growth of a nitride compound semiconductor material which means that there is a large degree of freedom in the selection of material for the carrier substrate. In particular, a carrier substrate can be selected which is characterized by comparatively low costs and/or effective thermal conductivity. For example, the carrier substrate can comprise a semiconductor material, a metal, a metal alloy or a ceramic material. In particular, the carrier substrate can comprise Ge, GaAs, AlN, Mo, Au or an alloy with Mo or Au.

In accordance with one embodiment, in a further method step, the transfer layer is separated in the lateral direction along the separation zone by means of heat treatment. During the heat treatment, the transfer layer is heated, e.g., to a temperature in the range of 300° C. to 900° C., preferably to a temperature in the range between 300° C. and 700° C. Heating can be effected, for example, by increasing the ambient temperature, e.g., in a furnace, or even by heating, in places, by electromagnetic radiation, e.g., laser or microwave radiation.

During the heat treatment, the implanted ions diffuse in the separation zone and produce bubbles (so-called blisters). The propagation of the bubbles in the separation zones finally leads to the separation of the transfer layer into a first part which is disposed on the growth substrate and a second part which is disposed on the carrier substrate.

The first part of the transfer layer which after separation is disposed on the growth substrate is preferably subsequently removed from the growth substrate, e.g., by means of an etching or polishing process in order then to be able to use the growth substrate for the epitaxial growth of further semiconductor layers. This is particularly advantageous when a comparatively expensive growth substrate such as, for example, GaN or sapphire is used.

A second part of the transfer layer is disposed on the carrier substrate after separation. Onto the surface of the transfer layer facing away from the carrier substrate, a further transfer layer is grown which contains at least one semiconductor layer consisting of $In_yGa_{1-y}N$ with $0<y\leq1$. The further transfer layer advantageously has a larger indium proportion y than the previously grown transfer layer. For example, the transfer layer first grown onto the growth substrate can comprise $In_{0.03}Ga_{0.97}N$ and the further transfer layer can comprise $In_{0.06}Ga_{0.94}N$.

In accordance with one embodiment, in a further method step, ions are implanted into the further transfer layer to form a separation zone. Subsequently, a further carrier substrate is applied to the further transfer layer and the further transfer layer is subsequently separated along the separation zone by way of heat treatment. The method steps of implanting ions into the further transfer layer, applying a further carrier substrate to the further transfer layer and separating the further transfer layer along the separation zone by way of heat treatment are effected in accordance with the advantageous embodiments previously described in conjunction with the transfer layer grown onto the growth substrate.

In a further method step, a semiconductor layer sequence containing an active layer is epitaxially grown onto the surface of the further transfer layer facing away from the further carrier substrate. The further carrier substrate with the lastly applied further transfer layer thus functions as a quasi-substrate for growing the semiconductor layer sequence of the optoelectronic component containing the active layer.

By growing the transfer layer having the indium content x onto the growth substrate, transferring the transfer layer to a carrier substrate, growing a further transfer layer having a higher indium content y onto the transfer layer and subsequently transferring the further transfer layer to a further carrier substrate, a quasi-substrate for growing the semiconductor layer sequence of the optoelectronic component is advantageously created, which has a high indium content compared with the growth substrate and a comparatively high lattice constant resulting therefrom. The thus produced quasi-substrate allows the growth of a semiconductor layer sequence which comprises one or several layers consisting of InGaN having small layer stresses and a high crystal quality. In particular, in this manner an active layer containing InGaN can be grown with a high layer quality.

In a preferred embodiment, the method steps of growing the further transfer layer, implanting ions into the further transfer layer, applying a further carrier substrate and separating the further transfer layer are repeated once or several times, wherein the respective at least one semiconductor layer of the further transfer layer has a higher indium proportion than the at least one semiconductor layer of the respectively previously applied transfer layer. The indium proportion in the at least one semiconductor layer of the further transfer layer is thus advantageously gradually increased with each repetition.

The invention makes use of the knowledge that the mechanical stresses produced during the growth of the transfer layer onto the growth substrate and/or a previously grown transfer layer are reduced during the separation of the transfer layer and the removal, associated therewith, of the growth surface used for the epitaxial growth. If these method steps are repeated once or even several times, the lastly applied transfer layer can have a comparatively high indium content, wherein, however, in spite of this it only has small mechanical stresses and a high crystal quality.

In a preferred embodiment, the indium proportion y of the at least one semiconductor layer of the further transfer layer is greater than the indium proportion of the at least one semiconductor layer of the previously applied transfer layer by a value between 0.02 and 0.05 inclusive, particularly preferably by a value between 0.03 and 0.04 inclusive.

The indium proportion is advantageously increased in this case such that when growing the further transfer layer only a small lattice mismatch with respect to the preceding transfer layer is present, wherein on the other hand, however, the increase in the indium proportion is sufficiently large for a target value for the indium proportion to be achieved with a number of repetitions which is not too high.

In a preferred embodiment, the number of repetitions is at least two, particularly preferably between two and eight inclusive.

In an advantageous embodiment, the lastly applied transfer layer, onto which the semiconductor layer sequence of the optoelectronic component is grown, contains $In_yGa_{1-y}N$ with $y \geq 0.1$, preferably $y \geq 0.2$, particularly preferably $y \geq 0.3$. The lastly used carrier substrate with the lastly applied transfer layer thus forms a quasi-substrate for the semiconductor layer sequence of the optoelectronic component having a high indium content.

The method is particularly suitable for producing an optoelectronic component in which the active layer has a high indium content. In a preferred embodiment, the active layer contains at least one layer consisting of $In_zGa_{1-z}N$ with $z \geq 0.1$. Preferably, $z \geq 0.2$, particularly preferably $z \geq 0.3$. The active layer can be formed, for example, as a pn-transition, as a double heterostructure, as a single quantum well structure or multiple quantum well structure.

In accordance with an advantageous embodiment, the active layer is a radiation-emitting layer which is suitable for emitting radiation having a wavelength of 450 nm or more, particularly preferably of 600 nm or more.

In a preferred embodiment, the transfer layer and/or the at least one further transfer layer has a thickness between 200 nm and 2 μm inclusive. This thickness range is advantageous for the method steps of ion implantation for forming a separation zone and separation of the transfer layer by the heat treatment.

In one embodiment, the transfer layer and/or the at least one further transfer layer consists of a single semiconductor layer. The transfer layer and/or the at least one further transfer layer can, in this case, be advantageously grown onto the growth substrate and/or the previously applied transfer layer in a single method step.

However, it is also alternatively possible for the transfer layer and/or the at least one further transfer layer to comprise several sublayers which form a superlattice structure. In particular, in this embodiment, the transfer layer and/or the at least one further transfer layer can comprise an $In_{x1}Ga_{1-x1}N/In_{x2}Ga_{1-x2}N$ superlattice with $x2 > x1$. By forming a superlattice, mechanical stresses which are generated when growing a single transfer layer can be advantageously reduced.

In a preferred embodiment, the growth substrate is a GaN substrate or a sapphire substrate. These comparatively expensive growth substrates can be used again for growing purposes after the removal of at least a part of the transfer layer and/or the further transfer layer. Preferably, a part of the transfer layer remaining on the growth substrate after separating the transfer layer is removed from the growth substrate by means of an etching or polishing process in order to prepare it for the epitaxial growth of further semiconductor layers.

In the method, the carrier substrate and/or the further carrier substrate preferably comprises Ge, GaAs, AlN, Mo, Au or alloys with Au or Mo. These materials are characterized in particular by an effective thermal conductivity and/or electrical conductivity.

BRIEF DESCRIPTION OF THE DRAWINGS

The invention will be explained in more detail hereinafter with the aid of exemplified embodiments in conjunction with FIGS. 1 to 13, in which.

Like parts, or parts acting in an identical manner, are provided with the same reference numerals in each case in the

DETAILED DESCRIPTION OF ILLUSTRATIVE EMBODIMENTS

Figure 1:
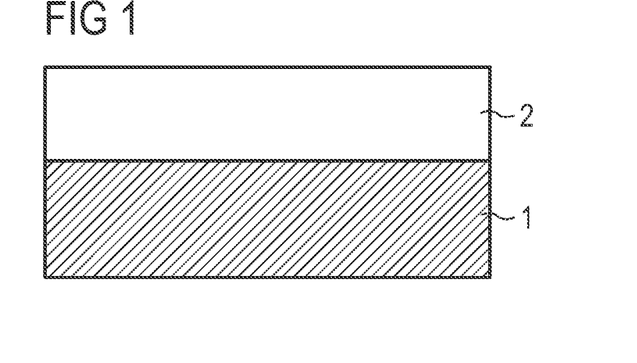
FIGS. 1 to 12 show a schematic illustration of an exemplified embodiment of the method for producing an optoelectronic component using intermediate steps.

In the first intermediate step of the method illustrated in FIG. 1, a transfer layer 2 has been grown onto a growth substrate 1. The transfer layer 2 is grown epitaxially, e.g., by means of MOVPE (Metal Organic Vapor Phase Epitaxy). The growth substrate 1 is a growth substrate, preferably a sapphire substrate or a GaN substrate, suitable for the epitaxial growth of a nitride compound semiconductor.

The transfer layer 2 is a semiconductor layer consisting of $In_xGa_{1-x}N$ with $0<x<1$. The indium content x of the transfer layer 2 grown directly onto the growth substrate is preferably between 0.02 and 0.05 inclusive, particularly preferably between 0.03 and 0.04 inclusive. The indium content x of the transfer layer 2 is in this case comparatively low which means that the transfer layer 2 has only a small lattice mismatch with respect to the growth substrate 1. This has the advantage that mechanical stresses when growing the transfer layer 2 are small which means that the transfer layer 2 can be grown with a high layer quality. The thickness of the transfer layer 2 is preferably between 200 nm and 2 µm inclusive.

Figure 2:
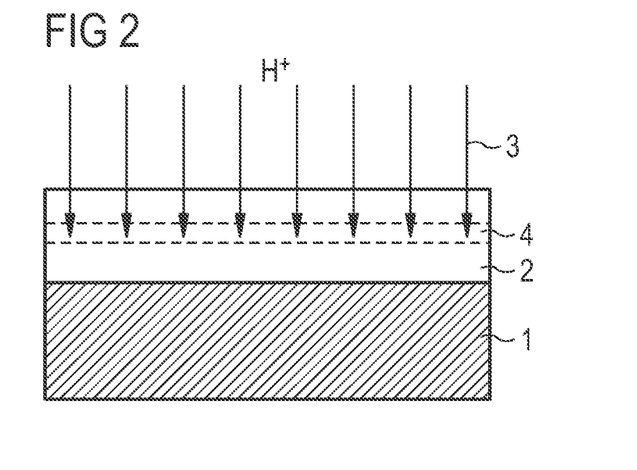

In the further intermediate step of the method illustrated in FIG. 2, hydrogen ions 3 are implanted, as indicated by the arrows, into the transfer layer 2 to form a separation zone 4. As an alternative to hydrogen ions 3, other ions, e.g., ions of inert gases such as helium, neon, krypton or xenon, can also be implanted into the transfer layer 2. The position of the separation zone 4 in the transfer layer 2 is determined by the penetration depth of the ions 3 into the semiconductor material of the transfer layer 2 and can thus be adjusted in a targeted manner by the energy of the implanted ions 3.

Figure 3:
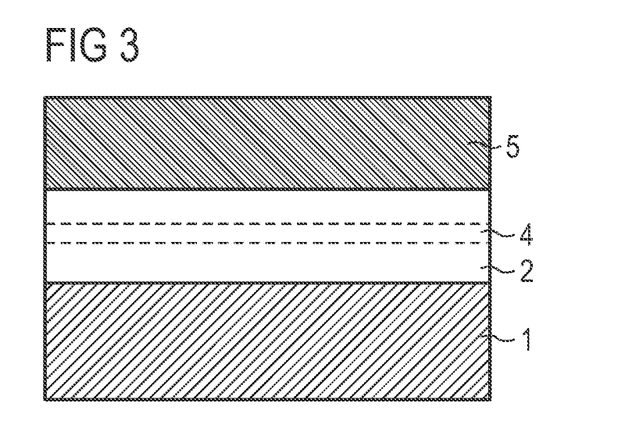

In the intermediate step illustrated in FIG. 3, a carrier substrate 5 has been applied to a surface of the transfer layer 2 opposite to the growth substrate 1. The carrier substrate 5 can be connected to the transfer layer 2, for example, by soldering or bonding. The carrier substrate can be, for example, a substrate consisting of Ge, GaAs, AlN, a metal such as, for example, Mo, Au or alloys thereof. In particular, the carrier substrate 5 does not have to be suitable for the epitaxial growth of a nitride compound semiconductor material and can thus be advantageously selected based on other criteria such as, for example, the coefficient of thermal expansion, thermal conductivity, and/or electrical conductivity. In particular, a carrier substrate 5 which is comparatively cost-effective compared with GaN or sapphire can be used.

Figure 4:
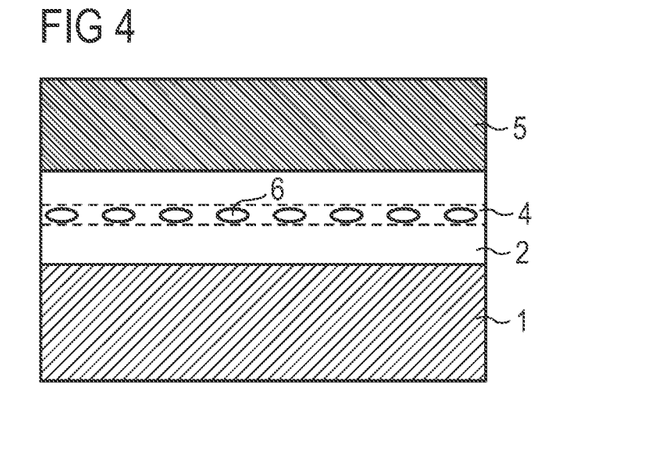

Subsequently, as illustrated schematically in FIG. 4, heat treatment is effected, wherein the composite consisting of the growth substrate 1, the transfer layer 2 and the carrier substrate 5 is heated to a temperature between approximately 300° C. and 900° C., preferably between 300° C. and 700° C. inclusive. Bubbles 6 (so-called blisters) are formed in the separation zone 4, into which the hydrogen ions were previously implanted, and are propagated in the separation zone 4 as the length of time of the heat treatment increases.

Figure 5:
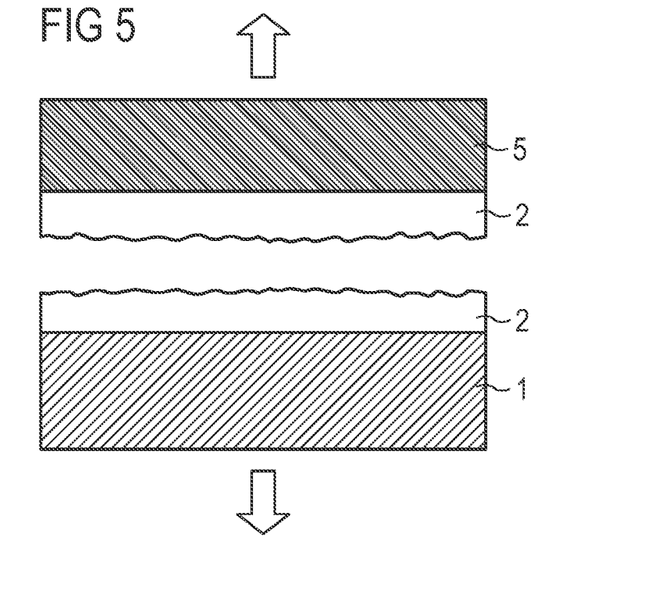

As illustrated in FIG. 5, this finally results in the fact that the transfer layer 2 is separated in the lateral direction in the region of the separation zone 4. The transfer layer 2 can be separated along the separation zone 4 by virtue of a mechanical effect in that, for example, a torque is exerted onto the growth substrate 1 and/or the carrier substrate 5. After the separation of the transfer layer 2, for example, a part of the transfer layer 2 is disposed on the growth substrate 1 and a further part of the transfer layer 2 is disposed on the carrier substrate 5. The part of the transfer layer 2 remaining on the growth substrate 1 can be removed from the growth substrate 1, for example, by means of an etching or polishing process, which means that this growth substrate can then be used for growing further transfer layers. This is particularly advantageous when a high-quality growth substrate 1 such as, for example, GaN or sapphire is used.

Figure 6:
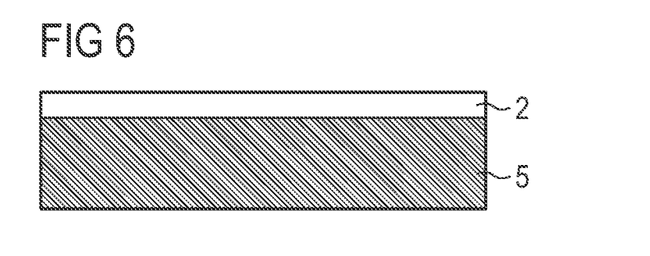

The part of the transfer layer 2 remaining on the carrier substrate 5 is preferably smoothed using an etching or polishing method so that the composite consisting of the carrier substrate 5 and the transfer layer 2 disposed thereon forms a quasi-substrate for growing one or several further semiconductor layers. The thus produced composite consisting of the carrier substrate 5 and the preferably smoothed transfer layer 2 is illustrated in FIG. 6. Further heat treatment can additionally be effected in order to cure any damage to the crystal structure of the transfer layer 2 caused by the previous ion implantation.

Figure 7:
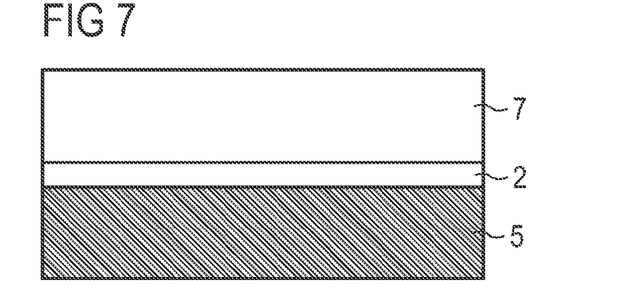

In a further method step, a further transfer layer 7 is grown onto the surface of the transfer layer 2 facing away from the carrier substrate 5, as illustrated in FIG. 7. The further transfer layer 7 is a layer consisting of $In_yGa_{1-y}N$, the indium content y of which is higher than the indium content of the previously applied transfer layer 2. Preferably, the indium content y of the further transfer layer 7 is greater than the indium content of the previously applied transfer layer 2 by a value between 0.02 and 0.05 inclusive, particularly preferably between 0.03 and 0.04 inclusive. The further transfer layer 7 thus advantageously has only a comparatively small lattice mismatch with respect to the previously grown transfer layer 2. This has the advantage that the further transfer layer 7 can be grown onto the previously applied transfer layer 2 with small stress and a comparatively high layer quality.

Figure 8:
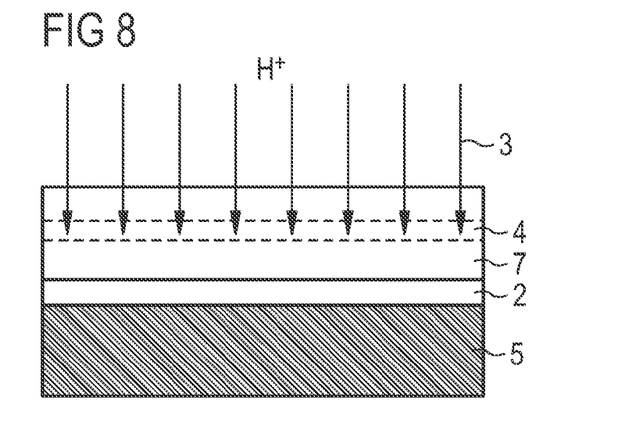

Subsequently, as illustrated in FIG. 8, ions 3, preferably hydrogen ions, are implanted into the further transfer layer 7 to form a separation zone 4.

Figure 9:
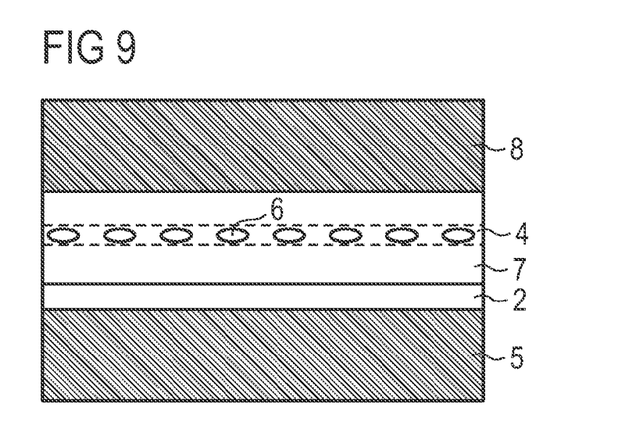

As illustrated in FIG. 9, a further carrier substrate 8 is subsequently applied to the surface of the further transfer layer 7 opposite to the carrier substrate 5. Subsequently, heat treatment is effected, wherein the ions implanted into the further transfer layer 7 diffuse in the separation zone 4 and form bubbles 6.

Figure 10:
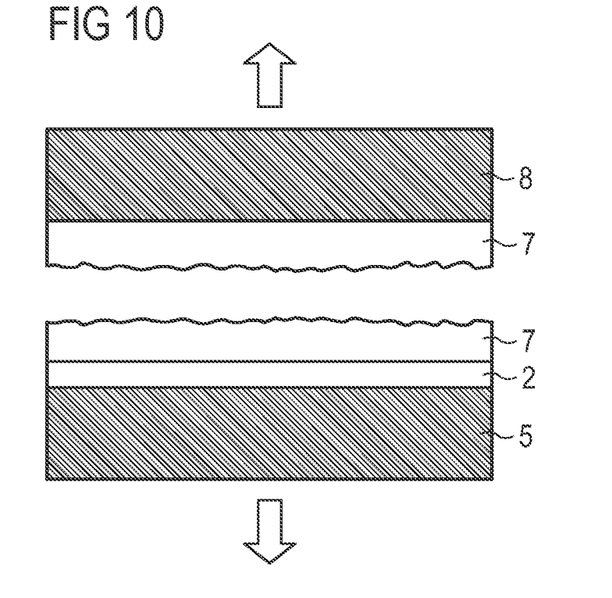

As illustrated in FIG. 10, this results in separation of the further transfer layer 7 along the separation zone 4.

Figure 11:
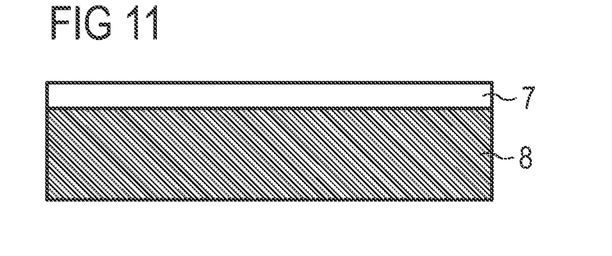

The part of the further transfer layer 7 remaining on the further carrier substrate 8 can subsequently be smoothed, for example, by means of an etching or polishing method which means that the composite, illustrated in FIG. 11, consisting of the further carrier substrate 8 and the further transfer layer 7 forms a quasi-substrate for the epitaxial growth of one or several further semiconductor layers.

Advantageous embodiments of the method steps illustrated in FIGS. 8 to 11 correspond to the method steps explained previously in conjunction with FIGS. 2 to 6.

The method steps illustrated in FIGS. 7 to 11 can subsequently be repeated once or several times, wherein the indium content y of the further transfer layer 7 is gradually increased with each repetition. Preferably, the indium content of the further transfer layer 7 is increased with each repetition by a value between 0.02 and 0.05 inclusive, in a preferred manner between 0.03 and 0.04 inclusive. In this manner it can be advantageously achieved that the quasi-substrate, which is illustrated in FIG. 11 and is formed by the composite consisting of the lastly used carrier substrate 8 and the lastly applied further transfer layer 7, comprises a growth surface for growing one or several further semiconductor layers, which growth surface has a comparatively high indium content. Preferably, the indium content y of the further transfer layer 7 is, after the lastly performed repetition, at least 0.1, preferably at least 0.2 and particularly preferably at least 0.3.

Figure 12:
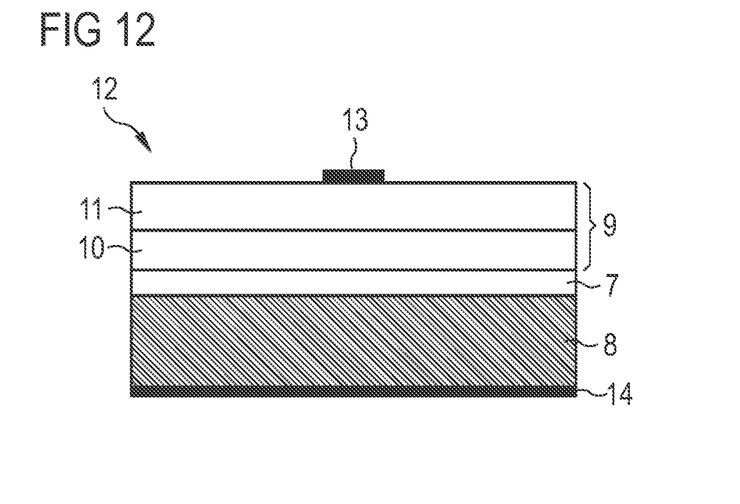

As illustrated in FIG. 12, the semiconductor layer sequence 9 of an optoelectronic component 12 is subsequently grown onto the surface of the further transfer layer 7 facing away from the further carrier substrate 8. The semiconductor layer sequence 9 of the optoelectronic component 12 contains in particular the active layer 10. Furthermore, the semiconductor layer sequence 9 can contain one or several further semiconductor layers 11.

The active layer 10 of the optoelectronic component 12 contains preferably at least one layer consisting of $In_zGa_{1-z}N$ with $z≥0.1$, preferably $z≥0.2$ and particularly preferably $z≥0.3$. The active layer 10 having this comparatively high indium content can be grown onto the further transfer layer 7 with small stress and a high crystal quality, since the further transfer layer 7 also has a comparatively high indium content. Preferably, the indium content in the active layer 10 is not more than 0.05, preferably not more than 0.02 greater than the indium content in the further transfer layer 7. In a particularly preferred manner, the active layer 10 and the further transfer layer 7 have the same indium content.

In one embodiment, the active layer 10 can be a single quantum well structure or multiple quantum well structure. For the purposes of electric contacting, the optoelectronic component 12 can be provided with electric contacts 13, 14. The optoelectronic component 12 can be in particular an LED or a semiconductor laser. The optoelectronic component 12 is preferably a radiation-emitting optoelectronic component which has an emission wavelength of more than 450 nm, preferably more than 600 nm. Emission wavelengths of this size can be produced in the nitride compound semiconductor-based active layer in particular by way of the comparatively high indium content.

Figure 13:
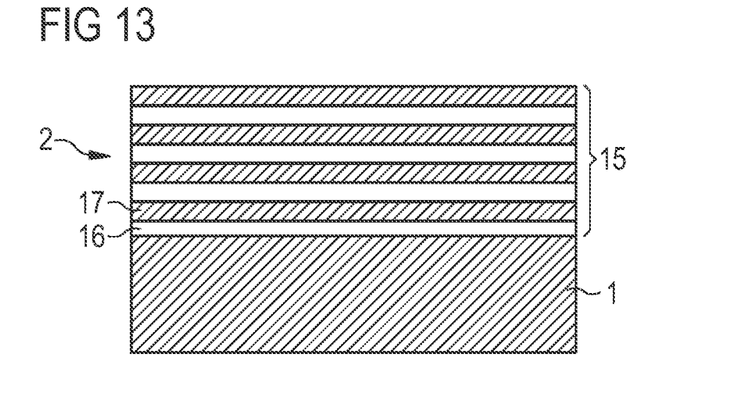
FIG. 13 shows a schematic illustration of a growth substrate having the transfer layer in a further exemplified embodiment of the method.

By way of example, the first method step in a further exemplified embodiment of the method is illustrated in FIG. 13, wherein the transfer layer 2 has been epitaxially grown onto the growth substrate 1. The transfer layer 2 and/or the further transfer layer do not necessarily have to be formed in the method by a single semiconductor layer. Rather, the transfer layer 2 and/or the further transfer layer can include several sublayers. In particular, the transfer layer 2 and/or the further transfer layer can be configured as a superlattice structure 15. In this exemplified embodiment, the transfer layer 2 comprises a superlattice structure 15 consisting of alternating first sublayers 16 consisting of $In_{x1}Ga_{1-x1}N$ with $0<x1<1$ and second sublayers 17 consisting of $In_{x2}Ga_{1-x2}N$ with $0<x2<1$ and $x2>x1$. The further method steps correspond to the exemplified embodiment illustrated in conjunction with FIGS. 1 to 12 and therefore will not be explained again.

Like the transfer layer 2 illustrated in FIG. 13, the subsequently applied further transfer layers 7 can also be formed as a superlattice structure 15. In this configuration, the indium contents x1 and x2 are preferably increased by a value between 0.02 and 0.05, preferably between 0.03 and 0.04 each time the growth of a further transfer layer 7 is repeated. By configuring the transfer layer 2 and/or the further transfer layer 7 as a superlattice structure 15, stresses in the semiconductor material can be further reduced.

The invention is not limited by the description using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. A method for producing an optoelectronic component, the method comprising:
   a.) epitaxially growing a transfer layer onto a growth substrate, the transfer layer containing a first semiconductor layer comprising $In_xGa_{1-x}N$ with $0<x<1$;
   b.) implanting ions into the transfer layer to form a separation zone;
   c.) applying a carrier substrate to a surface of the transfer layer opposite to the growth substrate;
   d.) separating the transfer layer in a lateral direction along the separation zone by way of heat treatment;
   e.) growing a further transfer layer onto a surface of the previously grown transfer layer facing away from the carrier substrate, the further transfer layer containing a second semiconductor layer comprising $In_yGa_{1-y}N$ with $0<y<1$, wherein the second semiconductor layer of the further transfer layer has a higher indium proportion y than the first semiconductor layer;
   f.) implanting ions into the further transfer layer to form a second separation zone;
   g.) applying a further carrier substrate to the further transfer layer;
   h.) separating the further transfer layer in the lateral direction along the second separation zone by way of heat treatment; and
   i.) epitaxially growing a semiconductor layer sequence, containing an active layer, onto the surface of the further transfer layer facing away from the further carrier substrate.

2. The method as claimed in claim 1, wherein the active layer comprises a layer consisting of $In_zGa_{1-z}N$ with $z≥0.1$.

3. The method as claimed in claim 1, wherein the active layer comprises a layer consisting of $In_zGa_{1-z}N$ with $z≥0.3$.

4. The method as claimed in claim 1, wherein the active layer is suitable to emit radiation having a wavelength of 450 nm or more.

5. The method as claimed in claim 1, wherein the active layer is suitable to emit radiation having a wavelength of 600 nm or more.

6. The method as claimed in claim 1, wherein the transfer layer and/or the further transfer layer has a thickness between 200 nm and 2 μm inclusive.

7. The method as claimed in claim 1, wherein the transfer layer and/or the further transfer layer consists of a single semiconductor layer.

8. The method as claimed in claim 1, wherein the transfer layer and/or the further transfer layer comprises several sublayers that form a superlattice structure.

9. The method as claimed in claim 1, wherein the carrier substrate and/or the further carrier substrate comprises Ge, GaAs, AlN, Mo, Au or an alloy with Au or Mo.

10. The method as claimed in claim 1, wherein the first semiconductor layer consists of $In_xGa_{1-x}N$ with $0<x<1$, and wherein the second semiconductor layer consists of $In_yGa_{1-y}N$ with $0<y≤1$.

11. A method for producing an optoelectronic component, the method comprising:
   a.) epitaxially growing a transfer layer onto a growth substrate, the transfer layer containing a first semiconductor layer comprising $In_xGa_{1-x}N$ with $0<x<1$;
   b.) implanting ions into the transfer layer to form a separation zone;
   c.) applying a carrier substrate to a surface of the transfer layer opposite to the growth substrate;
   d.) separating the transfer layer in a lateral direction along the separation zone by way of heat treatment;

e.) growing a further transfer layer onto a surface of the previously grown transfer layer facing away from the carrier substrate, the further transfer layer containing a second semiconductor layer comprising $In_y Ga_{1-y}N$ with $0<y\le1$, wherein the second semiconductor layer of the further transfer layer has a higher indium proportion y than the first semiconductor layer;

f.) implanting ions into the further transfer layer to form a second separation zone;

g.) applying a further carrier substrate to the further transfer layer;

h.) separating the further transfer layer in the lateral direction along the second separation zone by way of heat treatment; and i.) epitaxially growing a semiconductor layer sequence, containing an active layer, onto the surface of the further transfer layer facing away from the further carrier substrate, wherein the steps e) to h) are repeated once or several times, and wherein the second semiconductor layer of each further transfer layer has a higher indium proportion y than the second semiconductor layer of the respectively previously applied further transfer layer.

12. The method as claimed in claim 11, wherein the indium proportion y of the second semiconductor layer of each further transfer layer is greater than the indium proportion of the second semiconductor layer of the previously applied transfer layer by a value between 0.02 and 0.05.

13. The method as claimed in claim 11, wherein the steps e) to h) are repeated at least twice.

14. The method as claimed in claim 13, wherein the steps e) to h) are repeated between two and eight times, inclusive.

15. The method as claimed in claim 11, wherein the lastly applied transfer layer comprises $In_y Ga_{1-y}N$ with $y\ge0.1$.

16. The method as claimed in claim 15, wherein the lastly applied transfer layer comprises $In_y Ga_{1-y}N$ with $y\ge0.3$.

17. A method for producing an optoelectronic component, the method comprising:

a.) epitaxially growing a transfer layer onto a growth substrate, the transfer layer containing a first semiconductor layer comprising $In_x Ga_{1-x}N$ with $0<x<1$;

b.) implanting ions into the transfer layer to form a separation zone;

c.) applying a carrier substrate to a surface of the transfer layer opposite to the growth substrate;

d.) separating the transfer layer in a lateral direction along the separation zone;

e.) growing a further transfer layer onto a surface of the previously grown transfer layer facing away from the carrier substrate, the further transfer layer containing a second semiconductor layer comprising $In_y Ga_{1-y}N$ with $0<y\le1$, wherein the second semiconductor layer of the further transfer layer has a higher indium proportion y than the first semiconductor layer;

f.) implanting ions into the further transfer layer to form a second separation zone;

g.) applying a further carrier substrate to the further transfer layer;

h.) separating the further transfer layer in the lateral direction along the second separation zone; and i.) epitaxially growing a semiconductor layer sequence, containing an active layer, onto the surface of the further transfer layer facing away from the further carrier substrate, wherein the steps e) to h) are repeated several times, and wherein an indium proportion y is gradually increased for each successive further transfer layer.

* * * * *